US012751317B2

(12) United States Patent
Liang

(10) Patent No.: US 12,751,317 B2
(45) Date of Patent: Sep. 29, 2026

(54) POWER SEMICONDUCTOR MODULE

(71) Applicant: WUXI LEAPERS SEMICONDUCTOR CO., LTD., Wuxi (CN)

(72) Inventor: Xiaoguang Liang, Wuxi (CN)

(73) Assignee: WUXI LEAPERS SEMICONDUCTOR CO., LTD., Wuxi (CN)

(*) Notice: Subject to any disclaimer, the term of this patent is extended or adjusted under 35 U.S.C. 154(b) by 480 days.

(21) Appl. No.: 17/926,623

(22) PCT Filed: Mar. 16, 2021

(86) PCT No.: PCT/CN2021/080899
§ 371 (c)(1),
(2) Date: Nov. 20, 2022

(87) PCT Pub. No.: WO2021/248954
PCT Pub. Date: Dec. 16, 2021

(65) Prior Publication Data

US 2023/0187404 A1 Jun. 15, 2023

(30) Foreign Application Priority Data

Jun. 12, 2020 (CN) ......................... 202010535948.2

(51) Int. Cl.
*H10W 70/20* (2026.01)
*H10W 74/10* (2026.01)
(Continued)

(52) U.S. Cl.
CPC ........... *H10W 74/43* (2026.01); *H10W 70/22* (2026.01); *H10W 74/114* (2026.01);
(Continued)

(58) Field of Classification Search
CPC ..... H01L 24/37; H01L 23/291; H01L 23/293; H01L 23/3121; H01L 23/4922;
(Continued)

(56) References Cited

U.S. PATENT DOCUMENTS

2004/0099944 A1 5/2004 Kimura
2011/0042793 A1* 2/2011 Wong ...................... H01L 24/40 257/676
(Continued)

FOREIGN PATENT DOCUMENTS

CN 101165884 A 4/2008
CN 105706236 A 6/2016
(Continued)

OTHER PUBLICATIONS

J-Plat Pat translation of JP 06-244230 (Year: 1994).*
Espacenet translation of JP 6256309 (Year: 2018).*

*Primary Examiner* — Zandra V Smith
*Assistant Examiner* — Corbyn D Mellinger
(74) *Attorney, Agent, or Firm* — Bayramoglu Law Offices LLC

(57) ABSTRACT

A power semiconductor module includes a metal bottom plate, an insulating heat dissipation material layer, a chip, a binding plate, silica gel, and an outer housing, where the binding plate includes a copper plate and a copper strap. The copper plate is connected to the copper strap through welding, and the binding plate is configured to connect circuits of various components. The metal bottom plate is connected to the insulating heat dissipation material layer through tin soldering, the chip is connected to the insulating heat dissipation material layer through tin soldering, the chip is connected to the copper strap, and the copper strap is connected to the insulating heat dissipation material layer. The module can resolve the prior-art problem of mechanical stress generated on the chip in the case of a temperature
(Continued)

change when a relatively thick copper frame is applied to the packaging of the power semiconductor module.

5 Claims, 4 Drawing Sheets

(51) Int. Cl.

| | |
|---|---|
| ***H10W 74/43*** | (2026.01) |
| ***H10W 74/47*** | (2026.01) |
| *H10W 72/00* | (2026.01) |
| *H10W 72/30* | (2026.01) |
| *H10W 72/60* | (2026.01) |
| *H10W 90/00* | (2026.01) |

(52) U.S. Cl.

CPC ............ *H10W 74/47* (2026.01); *H10W 70/24* (2026.01); *H10W 72/352* (2026.01); *H10W 72/623* (2026.01); *H10W 72/624* (2026.01); *H10W 72/652* (2026.01); *H10W 72/886* (2026.01); *H10W 90/734* (2026.01); *H10W 90/764* (2026.01)

(58) Field of Classification Search

CPC ......... H01L 24/29; H01L 24/32; H01L 24/40; H01L 24/73; H01L 23/4924; H01L 2224/29111; H01L 2224/32225; H01L 2224/37028; H01L 2224/37032; H01L 2224/37147; H01L 2224/40225; H01L 2224/73263; H01L 23/053; H01L 23/24; H01L 23/5386; H01L 25/072; H01L 23/3735; H01L 23/367; H01L 2224/40; H01L 23/492

See application file for complete search history.

(56) References Cited

U.S. PATENT DOCUMENTS

| | | | | |
|---|---|---|---|---|
| 2011/0241198 | A1 | 10/2011 | Azuma | |
| 2016/0013073 | A1* | 1/2016 | Terasaki ................ | C04B 37/026 156/89.18 |
| 2016/0293563 | A1 | 10/2016 | Fujino et al. | |
| 2016/0300770 | A1* | 10/2016 | Taya ........................ | H01L 24/84 |

FOREIGN PATENT DOCUMENTS

| | | | | |
|---|---|---|---|---|
| CN | 105765715 | A | | 7/2016 |
| CN | 112289763 | A | | 1/2021 |
| CN | 212907719 | U | | 4/2021 |
| JP | H0396257 | A | | 4/1991 |
| JP | 06-244230 | | * | 9/1994 |
| JP | H09286845 | A | | 11/1997 |
| JP | 2003051560 | A | | 2/2003 |
| JP | 2006294882 | A | | 10/2006 |
| JP | 2008294362 | A | | 12/2008 |
| JP | 2010050395 | A | | 3/2010 |
| JP | 2016092346 | A | | 5/2016 |
| JP | 6256309 | | * | 1/2018 |
| JP | 2019054146 | A | | 4/2019 |
| JP | 2019220648 | A | | 12/2019 |
| WO | 2015079600 | A1 | | 6/2015 |
| WO | 2015111691 | A1 | | 7/2015 |

* cited by examiner

POWER SEMICONDUCTOR MODULE

CROSS REFERENCE TO THE RELATED APPLICATIONS

This application is the national phase entry of International Application No. PCT/CN2021/080899, filed on Mar. 16, 2021, which is based upon and claims priority to Chinese Patent Application No. 202010535948.2, filed on Jun. 12, 2020, the entire contents of which are incorporated herein by reference.

TECHNICAL FIELD

The present disclosure relates to the technical field of power semiconductor module packaging and, in particular, to a power semiconductor module.

BACKGROUND

Power semiconductor devices (such as an insulated gate bipolar transistor (IGBT), a metal-oxide-semiconductor field-effect transistor (MOSFET), silicon carbide (SiC), gallium nitride (GaN), and the like) are widely applied to power supplies and power electronic converters. Therefore, module packaging is generally used in a high-power scenario. A power module mainly includes a metal bottom plate, a welding layer, double-sided direct bonding copper (DBC) ceramic substrate, active metal bonding (AMB) ceramic substrate, an insulating heat dissipation resin film or other insulating heat dissipation materials, a copper frame, an outer housing, and silica gel, as shown in FIG. 2 and FIG. 3. Copper has strong conductivity, which can reduce turn-on resistance and parasitic inductance. In addition, the contact area between the copper frame and a chip is large, and the thermal expansion coefficient of the copper is $16.9\times10^{-6}$/K, which is much less than the thermal expansion coefficient of aluminum (namely, $23\times10^{-6}$/K) and closer to a thermal expansion coefficient of the chip (namely, $2\times10^{-6}$/K to $4\times10^{-6}$/K), thereby achieving a longer power cycle life. The bonding with the copper frame also has a series of disadvantages. First, the copper frame is generally made through stamping by using a special die, resulting in a high cost. Second, a relatively thick copper frame needs to be used to reduce the turn-on resistance. However, relatively large mechanical stress is generated on the chip when the temperature on the contact surface between the relatively thick copper frame and the chip changes, which may break or damage the chip in serious cases. Third, when a plurality of chips is connected to the DBC ceramic substrate or other insulating heat dissipation materials, the position of each chip may have a deviation. However, the position of each contact surface of the copper frame cannot be adjusted after the copper frame is processed, which may cause a position deviation during processing, resulting in defective products. To reduce defective products, accurate chip and frame positioning processes are required.

SUMMARY

The present disclosure provides a power semiconductor module to resolve the prior-art problem of mechanical stress generated on a chip in the case of a temperature change when a relatively thick copper frame is applied to the packaging of the power semiconductor module.

To resolve the above technical problem, the present disclosure provides a power semiconductor module, including a metal bottom plate, an insulating heat dissipation material layer, a chip, a binding plate, silica gel, and an outer housing. The binding plate includes a copper plate and a copper strap, where the copper plate is connected to the copper strap through welding and the binding plate is configured to connect circuits of various components. The metal bottom plate is connected to the insulating heat dissipation material layer through tin soldering. The chip is connected to the insulating heat dissipation material layer through tin soldering. The chip is connected to the copper strap, and the copper strap is connected to the insulating heat dissipation material layer.

The outer housing is connected to the metal bottom plate by using a dispensing process.

The silica gel is filled in the outer housing to prevent corrosion and moisture, protect an internal circuit, and isolate internal components with a high voltage.

The copper plate is connected to the copper strap through laser welding and ultrasonic welding.

The chip is connected to the copper strap through welding or sintering, and the copper strap is connected to the insulating heat dissipation material layer through welding or sintering.

The present disclosure has the following beneficial effects: 1. Compared with the prior art, in the power semiconductor module in the present disclosure, the copper strap in contact with the chip generates small mechanical stress on the chip when a temperature change occurs on the copper strap so it does not break or damage the chip. Most of the current of the circuit passes through the relatively thick copper plate, which greatly reduces turn-on resistance and parasitic inductance. 2. The position deviation of the chip can be compensated for by adjusting the position of the copper strap, thus lowering the requirement for a positioning process. This simplifies the processing technology and improves the yield of products.

Figure 1:
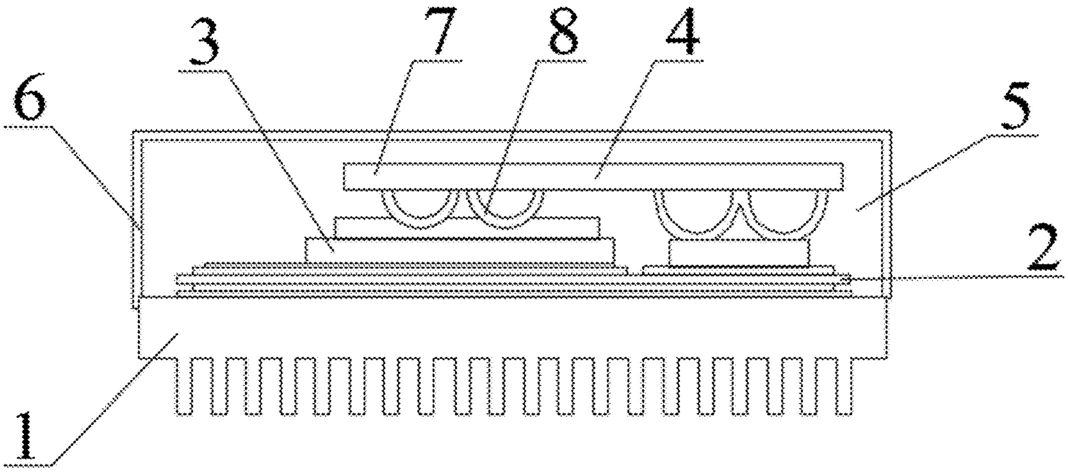
FIG. 1 is a schematic diagram of an overall structure of a power semiconductor module according to an embodiment of the present disclosure.
Figure 2:
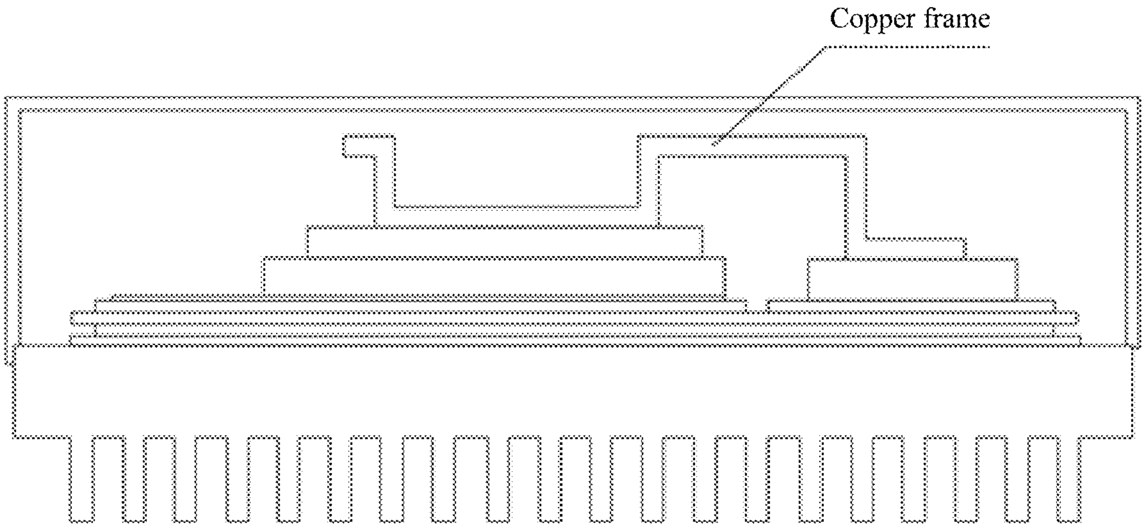
FIG. 2 (Prior Art)
FIG. 2 is a schematic diagram of an overall structure of a power semiconductor module with a copper frame.
Figure 3:
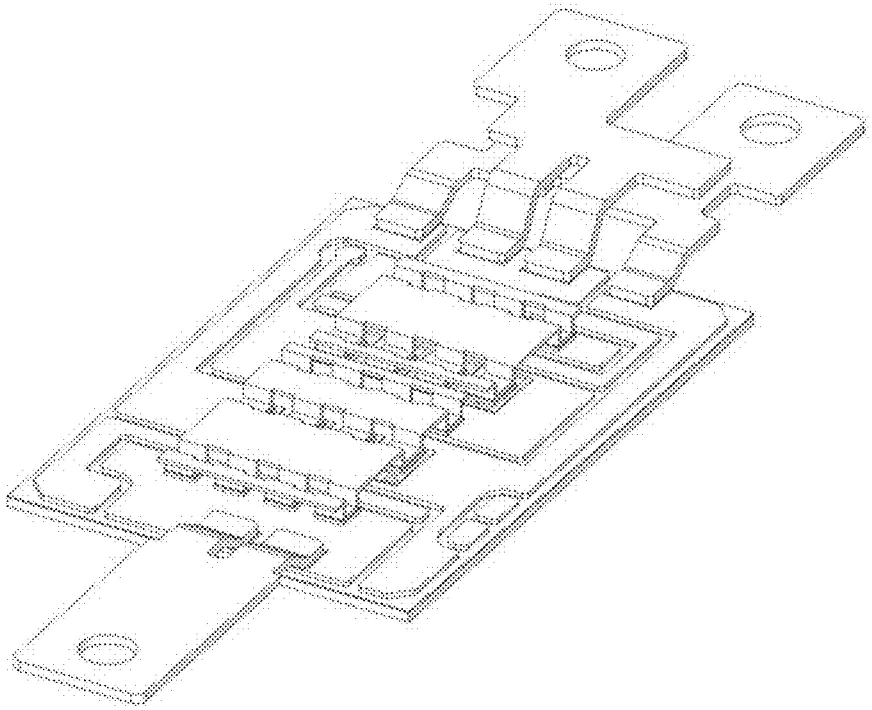
FIG. 3 (Prior Art)
FIG. 3 is a schematic diagram of a power semiconductor module with a copper frame.

Reference numerals: 1: metal bottom plate; 2: insulating heat dissipation material layer; 3: chip; 4: binding plate; 5: silica gel; 6: outer housing; 7: copper plate; 8: copper strap.

DETAILED DESCRIPTION OF THE EMBODIMENTS

To make the objective, technical solutions, and advantages of the present disclosure clear, the present disclosure will be further described in detail below by referring to the accompanying drawings and specific embodiments.

Embodiment 1

Figure 4:
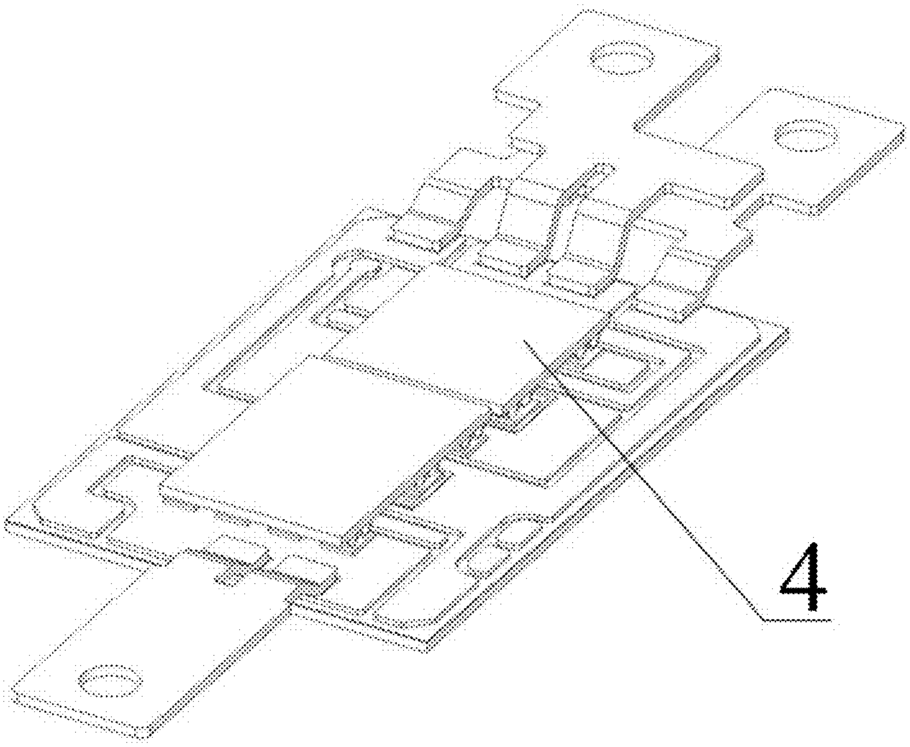
FIG. 4 is a first schematic diagram of a partial structure of a power semiconductor module according to an embodiment of the present disclosure.
Figure 5:
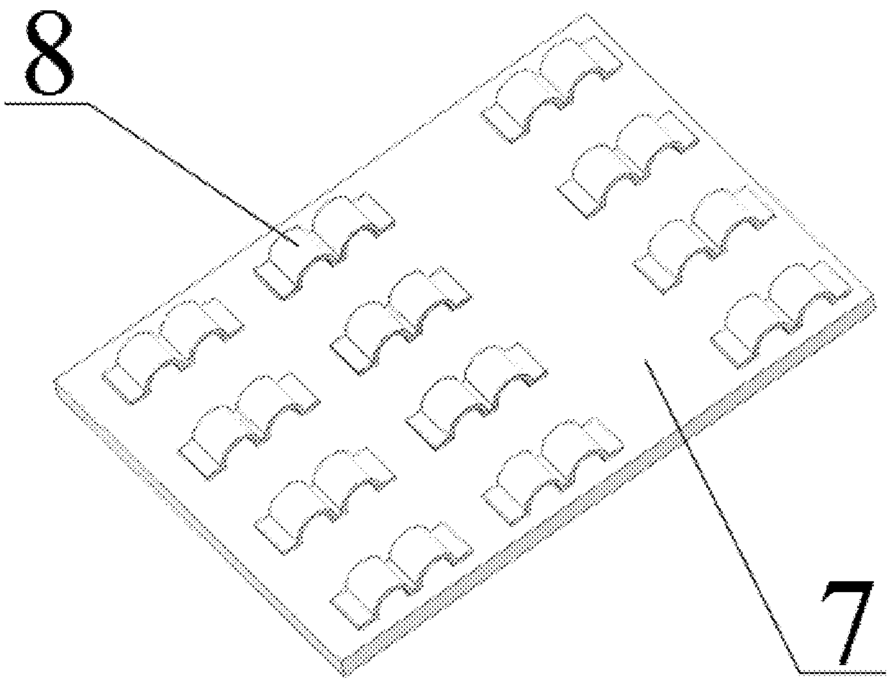
FIG. 5 is a first schematic structural diagram of a binding plate according to an embodiment of the present disclosure.

As shown in FIG. 1, FIG. 4, and FIG. 5, the present disclosure provides a power semiconductor module, including metal bottom plate 1, insulating heat dissipation material layer 2, chip 3, binding plate 4, silica gel 5, and outer housing 6. The binding plate 4 includes copper plate 7 and copper strap 8. The copper plate 7 is connected to the copper strap 8 through welding, and the binding plate 4 is configured to connect circuits of various components. The metal bottom plate 1 is connected to the insulating heat dissipation material layer 2 through tin soldering. The chip 3 is connected to the insulating heat dissipation material layer 2 through tin soldering. The chip 3 is also connected to the copper strap 8, and the copper strap 8 is connected to the insulating heat dissipation material layer 2.

Further, the outer housing 6 is connected to the metal bottom plate 1 by using a dispensing process.

Further, the silica gel 5 fills the outer housing 6 to prevent corrosion and moisture, protect an internal circuit, and isolate internal components with a high voltage.

Further, the copper plate 7 is connected to the copper strap 8 through laser welding and ultrasonic welding.

Further, the chip 3 is connected to the copper strap 8 through welding or sintering, and the copper strap 8 is connected to the insulating heat dissipation material layer 2 through welding or sintering.

The thickness of the copper plate 7 ranges from 1 mm to 2 mm, and the thickness of the copper strap 8 ranges from 0.3 mm to 0.8 mm.

Embodiment 2

Figure 6:
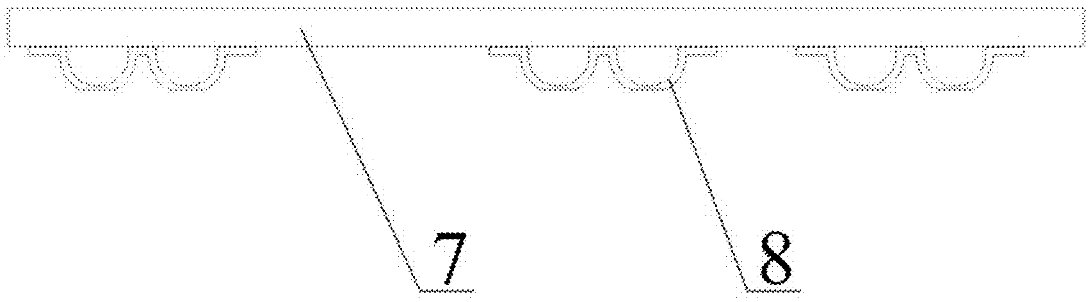
FIG. 6 is a second schematic structural diagram of a binding plate according to an embodiment of the present disclosure.

As shown in FIG. 1 and FIG. 6, the present disclosure provides a power semiconductor module, including metal bottom plate 1, insulating heat dissipation material layer 2, chip 3, binding plate 4, silica gel 5, and outer housing 6, where the binding plate 4 includes copper plate 7 and copper strap 8. The copper plate 7 is connected to the copper strap 8 through welding. The binding plate 4 is configured to connect circuits of various components. The metal bottom plate 1 is connected to the insulating heat dissipation material layer 2 through tin soldering. The chip 3 is connected to the insulating heat dissipation material layer 2 through tin soldering and, the chip 3 is connected to the copper strap 8, and the copper strap 8 is connected to the insulating heat dissipation material layer 2.

Further, the outer housing 6 is connected to the metal bottom plate 1 by using a dispensing process.

Further, the silica gel 5 fills the outer housing 6 to prevent corrosion and moisture, protect an internal circuit, and isolate internal components with a high voltage.

Further, the copper plate 7 is connected to the copper strap 8 through laser welding and ultrasonic welding.

Further, the chip 3 is connected to the copper strap 8 through welding or sintering, and the copper strap 8 is connected to the insulating heat dissipation material layer 2 through welding or sintering.

The thickness of the copper plate 7 ranges from 1 mm to 2 mm, and the thickness of the copper strap 8 ranges from 0.5 mm to 1 mm.

A contact surface between the copper strap 8 and the chip 3 is ground to eliminate a deviation, thereby increasing the contact area between the copper strap 8 and the chip 3. In addition, the thickness of the copper strap 8 on the contact surface between the copper strap 8 and the chip 3 is further reduced to reduce mechanical stress when the copper strap 8 is combined with the chip 3, thereby further improving reliability.

Embodiment 3

Figure 7:
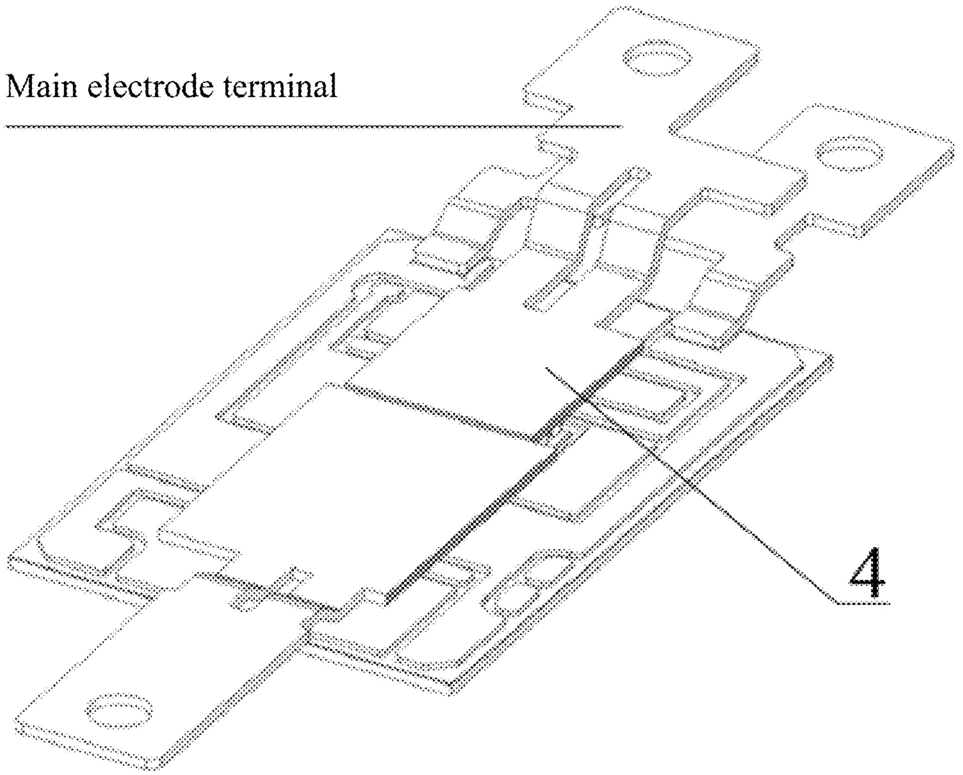
FIG. 7 is a second schematic diagram of a partial structure of a power semiconductor module according to an embodiment of the present disclosure.

As shown in FIG. 1 and FIG. 7, the present disclosure provides a power semiconductor module, including metal bottom plate 1, insulating heat dissipation material layer 2, chip 3, binding plate 4, silica gel 5, and outer housing 6, where the binding plate 4 includes copper plate 7 and copper strap 8. The copper plate 7 is connected to the copper strap 8 through welding, and the binding plate 4 is configured to connect circuits of various components. The metal bottom plate 1 is connected to the insulating heat dissipation material layer 2 through tin soldering, the chip 3 is connected to the insulating heat dissipation material layer 2 through tin soldering, the chip 3 is connected to the copper strap 8, and the copper strap 8 is connected to the insulating heat dissipation material layer 2.

Further, the outer housing 6 is connected to the metal bottom plate 1 by using a dispensing process.

Further, the silica gel 5 fills the outer housing 6 to prevent corrosion and moisture, protect an internal circuit, and isolate internal components with a high voltage.

Further, the copper plate 7 is connected to the copper strap 8 through laser welding and ultrasonic welding.

Further, the chip 3 is connected to the copper strap 8 through welding or sintering, and the copper strap 8 is connected to the insulating heat dissipation material layer 2 through welding or sintering.

The thickness of the copper plate 7 ranges from 1 mm to 2 mm, and the thickness of the copper strap 8 ranges from 0.3 mm to 0.8 mm.

The copper plate 7 and a main electrode terminal form an integrated structure.

In FIG. 4, the copper plate 7 is separated from an electrode terminal for connecting an external circuit, which generates additional resistance and parasitic inductance. In this embodiment, the copper plate 7 and the main electrode terminal form the integrated structure, thereby further reducing the resistance and parasitic inductance.

Embodiment 4

Figure 8:
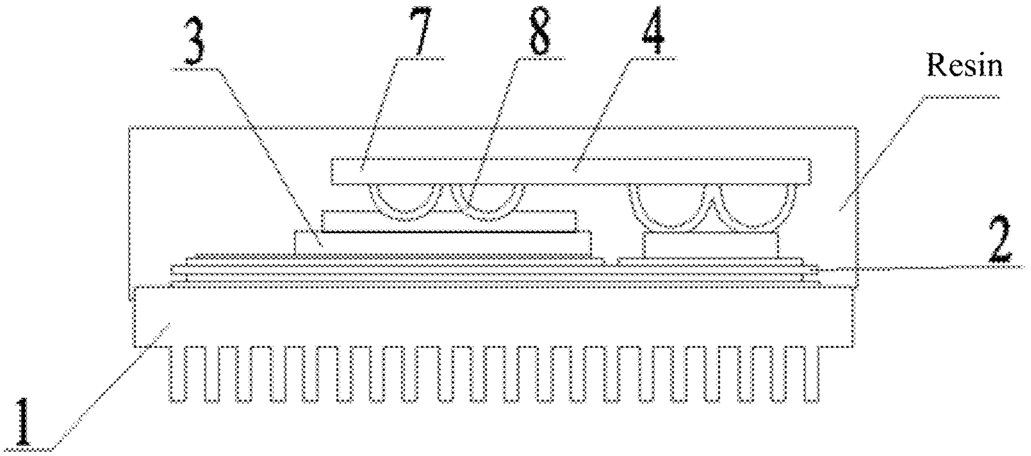
FIG. 8 is a schematic structural diagram of a power semiconductor module according to Embodiment 4 of the present disclosure.

As shown in FIG. 8, the present disclosure provides a power semiconductor module, including metal bottom plate 1, insulating heat dissipation material layer 2, chip 3, and binding plate 4. The binding plate 4 includes copper plate 7 and copper strap 8, and the copper plate 7 is connected to the copper strap 8 through welding. The binding plate 4 is configured to connect circuits of various components. The metal bottom plate 1 is connected to the insulating heat dissipation material layer 2 through tin soldering, the chip 3 is connected to the insulating heat dissipation material layer 2 through tin soldering, the chip 3 is connected to the copper strap 8, and the copper strap 8 is connected to the insulating heat dissipation material layer 2.

Further, the copper plate 7 is connected to the copper strap 8 through laser welding and ultrasonic welding.

Further, the chip 3 is connected to the copper strap 8 through welding or sintering, and the copper strap 8 is connected to the insulating heat dissipation material layer 2 through welding or sintering.

The thickness of the copper plate 7 ranges from 1 mm to 2 mm, and the thickness of the copper strap 8 ranges from 0.3 mm to 0.8 mm.

The semiconductor module is plastically packaged using a resin material. Based on the shape and parameter design needs, a special die is used to fill the resin into the semiconductor module. The chip 3, the insulating heat dissipation material layer 2, and the binding plate 4 of the semiconductor module are packaged and fixed, for example, 5 and 6 in FIG. 1 are replaced by an integrated resin material. This integrated plastic packaging method does not require silica gel or an outer housing, thereby simplifying the production process and achieving higher production efficiency and higher product reliability.

In conclusion, in the power semiconductor module in the present disclosure, the copper strap in contact with the chip generates small mechanical stress on the chip when a temperature change occurs on the copper strap so it does not break or damage the chip. Most of the current of the circuit passes through the relatively thick copper plate, which greatly reduces turn-on resistance and parasitic inductance. In addition, the position deviation of the chip can be compensated for by adjusting the position of the copper strap, thus lowering the requirement for a positioning process. This simplifies the processing technology and improves the yield of the product.

The above description describes merely preferred embodiments of the present disclosure and is not intended to limit the present disclosure, and various changes and modifications of the present disclosure may be made by those skilled in the art. Any modification, equivalent substitution, and improvement made within the spirit and principle of the present disclosure should fall within the protection scope of the claims of the present disclosure.

What is claimed is:

1. A power semiconductor module, comprising a metal bottom plate, an insulating heat dissipation material layer, a chip, a binding plate, silica gel, and an outer housing, wherein the binding plate comprises a copper plate and a two-dimensional array of copper straps extending along the copper plate in a first direction and a second direction, the copper plate is connected to each copper strap of the two-dimensional array of copper straps through welding such that copper of the copper plate is entirely contiguous without any gaps in the copper at all areas directly beneath an entirety of each copper strap of the two-dimensional array of copper straps, the binding plate is configured to connect circuits of various components, the metal bottom plate is connected to the insulating heat dissipation material layer through a tin soldering, the chip is connected to the insulating heat dissipation material layer through the tin soldering, the chip is connected to each copper strap of the two-dimensional array of copper straps, and each copper strap of the two-dimensional array of copper straps is connected to the insulating heat dissipation material layer, wherein the copper plate is a single-pieced plate without openings on the copper plate, wherein the copper plate is connected to the chip via a first part of the plurality of copper straps, and the copper plate is thermally connected to the insulating heat dissipation material layer via a second part of the plurality of copper straps, so that the copper plate, without touching with the outer housing, is only supported simultaneously by the insulating heat dissipation material layer and the chip through the plurality of copper straps.

2. The power semiconductor module according to claim 1, wherein the outer housing is connected to the metal bottom plate by using a dispensing process.

3. The power semiconductor module according to claim 1, wherein the silica gel fills the outer housing and prevents corrosion and moisture, protects an internal circuit, and isolates internal components with a high voltage.

4. The power semiconductor module according to claim 1, wherein the copper plate is connected to at least one of the copper straps of the two-dimensional array of copper straps through a laser welding and a ultrasonic welding.

5. The power semiconductor module according to claim 4, wherein the chip is connected to the at least one of the copper straps of the two-dimensional array of copper straps through a welding or a sintering, and the at least one of copper straps of the two-dimensional array of copper straps is connected to the insulating heat dissipation material layer through the welding or the sintering.

* * * * *